United States Patent
Choi et al.

(10) Patent No.: US 9,651,589 B2
(45) Date of Patent: May 16, 2017

(54) METHOD FOR CORRECTING ELECTRIC POWER LOSS IN AN HVDC SYSTEM

(71) Applicant: LSIS CO., LTD., Anyang-si, Gyeonggi-do (KR)

(72) Inventors: Yongkil Choi, Anyang-si (KR); Hoseok Choi, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 0 days.

(21) Appl. No.: 14/961,565

(22) Filed: Dec. 7, 2015

(65) Prior Publication Data
US 2016/0233780 A1    Aug. 11, 2016

(30) Foreign Application Priority Data
Feb. 11, 2015 (KR) .................. 10-2015-0021132

(51) Int. Cl.
*G01R 5/14* (2006.01)
*G01R 21/133* (2006.01)
(Continued)

(52) U.S. Cl.
CPC ....... *G01R 21/133* (2013.01); *G06F 17/5009* (2013.01); *H02J 3/36* (2013.01);
(Continued)

(58) Field of Classification Search
CPC .... G01R 1/073; G01R 19/10; G01R 31/2887; G01R 31/40; G01R 31/42; G01R 31/34; G01R 31/343; G01R 31/346
See application file for complete search history.

(56) References Cited

U.S. PATENT DOCUMENTS

| 2011/0005855 A1* | 1/2011 | Mikamo ............. B62D 5/046 180/443 |
| 2014/0247629 A1 | 9/2014 | Crane et al. |
| 2015/0066403 A1* | 3/2015 | Kashiwagi .......... G01R 21/133 702/60 |

FOREIGN PATENT DOCUMENTS

| CN | 102868177 | 1/2013 |
| CN | 103199718 | 7/2013 |

(Continued)

OTHER PUBLICATIONS

European Patent Office Application No. 15202463.4, Search Report dated Jun. 21, 2016, 9 pages.
(Continued)

*Primary Examiner* — Tung X Nguyen
(74) *Attorney, Agent, or Firm* — Lee, Hong, Degerman, Kang & Waimey

(57) ABSTRACT

A method for measuring electric power loss of a high voltage direct current (HVDC) system comprises the steps of measuring the amount of transmission electric power and the amount of receiving electric power; calculating a first electric power loss amount based on a difference value between the measured amount of the transmission electric power and the measured amount of the receiving electric power; calculating the amount of loss generated in each of positions in the HVDC system based on an impedance value of each of the positions; calculating a second electric power loss amount based on a sum value of the calculated loss amounts; and determining a correcting value for correcting the amount of electric power loss generated in the HVDC system based on a difference value between the first electric power loss amount and the second electric power loss amount.

7 Claims, 12 Drawing Sheets

(51) Int. Cl.
    *G06F 17/50*     (2006.01)
    *H02J 3/36*     (2006.01)
    *H02M 7/757*     (2006.01)
    *H02J 3/00*     (2006.01)

(52) U.S. Cl.
    CPC ...... *H02J 2003/007* (2013.01); *H02M 7/7575* (2013.01); *Y02E 60/60* (2013.01)

(56) References Cited

FOREIGN PATENT DOCUMENTS

| | | |
|---|---|---|
| CN | 103236702 | 8/2013 |
| JP | 53-024542 | 3/1978 |
| JP | 60-238768 | 11/1985 |
| JP | 07-227043 | 8/1995 |
| JP | 2003032895 | 1/2003 |
| JP | 2013219968 | 10/2013 |

OTHER PUBLICATIONS

Antonio De La Villa Jaen et al., "Voltage Source Converter Modeling for Power System State Estimation: STATCOM and VSC-HVDC" IEEE Service Center, vol. 23, No. 4, Nov. 1, 2008, 8 pages.
Japan Patent Office Application Serial No. 2016-000919, Office Action dated Nov. 29, 2016, 2 pages.

\* cited by examiner

METHOD FOR CORRECTING ELECTRIC POWER LOSS IN AN HVDC SYSTEM

CROSS-REFERENCE TO RELATED APPLICATION

Pursuant to 35 U.S.C. §119(a), this application claims the benefit of earlier filing date and right of priority to Korean Patent Application No. 10-2015-0021132, filed on Feb. 11, 2015, the contents of which is incorporated by reference herein in its entirety.

BACKGROUND OF THE INVENTION

1. Field of the Invention

The present invention relates to a High Voltage Direct Current (abbreviated as "HVDC" hereinafter) system and more particularly, to a method for correcting electric power loss generated between an electric power transmission station and an electric power receiving station of an HVDC system.

2. Background of the Invention

The HVDC system means an electric power transmission system that an electric power transmission station converts an alternating current electric power generated by an electric power station to a direct current electric power to transmit the electric power and then an electric power receiving station reconverts the direct current electric power to the alternating current electric power to supply the electric power.

The HVDC system is applied to undersea cable electric power transmission, large capacitor long-distance electric power transmission, interconnection among alternating current grids, etc. Also, the HVDC system enables interconnection in grids having different frequencies and asynchronism interconnection.

The electric power transmission station converts an alternating current electric power to a direct current electric power. That is, since the status that the alternating current electric power is transmitted using an undersea cable, etc. is very dangerous, the electric power transmission station converts the alternating current electric power to the direct current electric power and then transmits the electric power to the electric power receiving station.

Meanwhile, various kinds of voltage converters are used for the HVDC system, and a modular multi-level type voltage converter has recently received much attention.

The modular multi-level converter (can be abbreviated as "MMC") is a device that converts an alternating current electric power to a direct current electric power by using a plurality of sub-modules, and is operated by controlling each sub-module in any one of states of charge, discharge and bypass.

A central controller calculates the amount of transmission electric power transmitted from the electric power transmission station by using a voltage value and a current value, which are acquired through a metering transformer installed in the electric power transmission station.

Also, the central controller calculates the amount of electric power received by the electric power receiving station by using a voltage value and a current value, which are acquired through a metering transformer installed in the electric power receiving station.

Also, the central controller calculates the amount of electric power loss on the basis of a difference between the amount of transmission electric power and the amount of received electric power. However, in the related art, the difference value between the amount of transmission electric power and the amount of received electric power is simply recognized as the amount of electric power loss.

The HVDC system is designed and studied considering switching loss of each device, heat loss caused by impedance components, and harmonic wave loss.

However, a theoretical design value always has an error, and a range of the error is represented as a considerably high loss during actual system operation. Therefore, the HVDC system cannot be operated accurately due to the loss caused by the error, and the loss is recognized as a loss which is not generated actually. That is, it is difficult to measure the exact amount of electric power loss by simply using the difference value between the amount of transmission electric power and the amount of received electric power.

In this respect, a method for measuring actual loss by installing a plurality of current sensors, a plurality of voltage sensors, and a monitoring device in each device or electric line may be provided. However, it is difficult to actually apply this method to the system due to installation of too many devices, and even though the method is applied to the system, a problem occurs in that the cost is increased.

SUMMARY OF THE INVENTION

Therefore, the present invention is to solve the aforementioned problems. An object of the present invention is to provide a method for correcting electric power loss of an HVDC system that can detect the amount of electric power loss generated in a conversion station by using an impedance value of the conversion station.

Still another object of the present invention is to provide a method for correcting electric power loss of an HVDC system, which can correct the actual amount of electric power loss if there is a difference between the amount of electric power loss generated in a conversion station and the actual amount of electric power loss calculated based on an impedance value.

Further still another object of the present invention is to provide a method for correcting electric power loss of an HVDC system, which can detect the amount of electric power loss generated in each of an electric power transmission station, an electric power receiving station and an electric power transmission line and correct an error based on the detected amount of electric power loss.

The technical objects that can be achieved through the present invention are not limited to what has been particularly described hereinabove and other technical objects not described herein will be more clearly understood by persons skilled in the art from the following detailed description.

To achieve these and other advantages and in accordance with the purpose of this disclosure, as embodied and broadly described herein, a, a method for correcting electric power loss of a high voltage direct current system, the method comprising the steps of:

measuring the amount of transmission electric power and the amount of receiving electric power;

calculating a first electric power loss amount based on a difference value between the measured amount of the transmission electric power and the measured amount of the receiving electric power;

calculating the amount of loss generated in each of positions in the high voltage direct current system based on an impedance value of each of the positions;

calculating a second electric power loss amount based on a sum value of the calculated loss amounts; and determining a correcting value for correcting the amount of electric power loss generated in the high voltage direct current system based on a difference value between the first electric power loss amount and the second electric power loss amount.

According to another aspect of this invention, the step of calculating the amount of loss generated in each position comprises:

calculating the amount of loss generated in a first conversion station;

calculating the amount of loss generated in a second conversion station; and calculating the amount of loss generated in an electric power transmission line connecting the first conversion station with the second conversion station.

According to still another aspect of this invention, the correcting value comprises an offset value for measuring the first electric power loss amount as the same value as the second electric power loss amount.

According to still another aspect of this invention, the amount of transmission electric power is the amount of electric power in the first conversion station or the second conversion station, depending on an operation direction of the high voltage direct current system, and the amount of receiving electric power is the amount of electric power in the second conversion station or the first conversion station, depending on the operation direction of the high voltage direct current system.

According to still another aspect of this invention, the offset value is a correcting value for correcting an impedance value of the electric power transmission line.

According to still another aspect of this invention, the correcting values are determined as different values depending on the operation direction of the high voltage direct current system, and the operation direction comprises a first operation direction operating the first conversion station as an electric power transmission station and the second conversion station as an electric power receiving station and a second operation direction operating the first conversion station as an electric power receiving station and the second conversion station as an electric power transmission station.

According to still another aspect of this invention, the correcting values are determined as different values depending on the amount of operation electric power transmitting from the electric power transmission station to the electric power receiving station.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
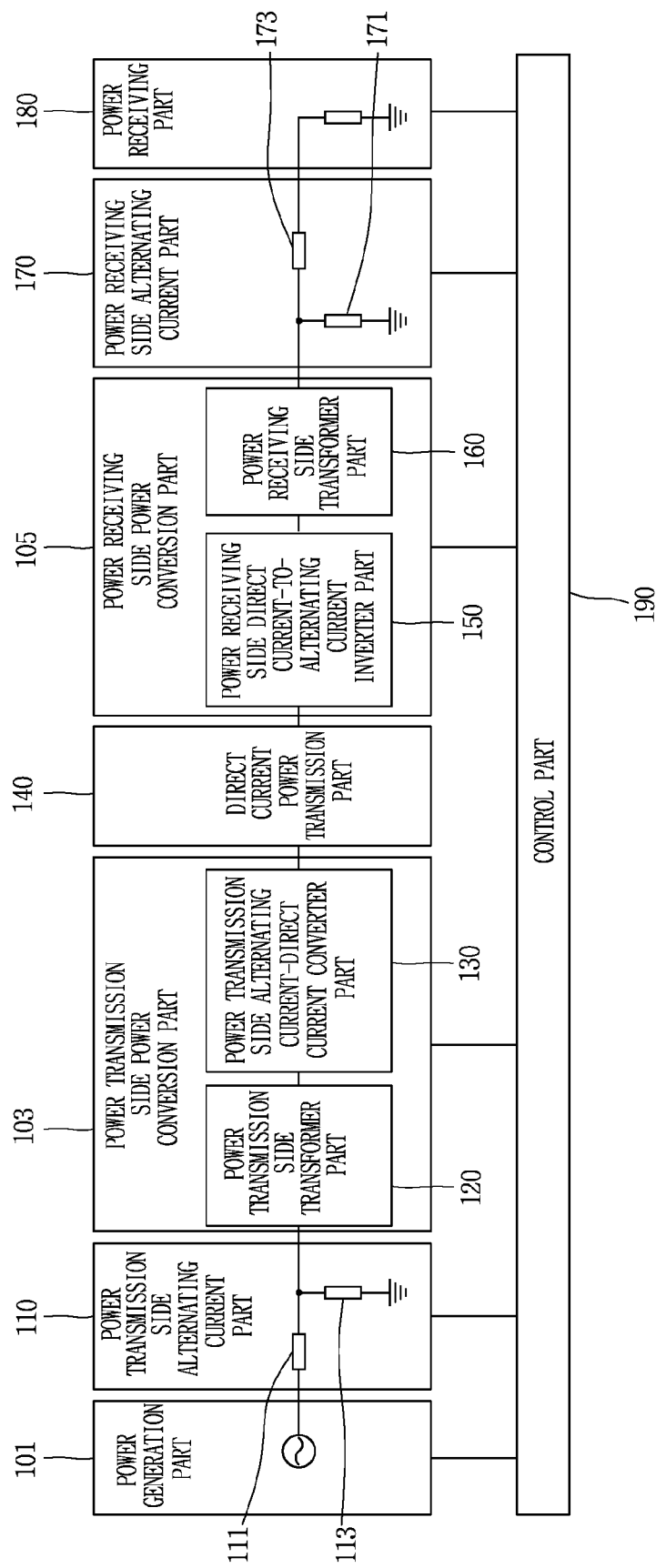
FIG. 1 illustrates configuration of an HVDC system according to one embodiment of the present invention.

Advantages and features of the present invention, and implementation methods thereof will be clarified through following embodiments described with reference to the accompanying drawings.

The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims. Wherever possible, the same reference numbers will be used throughout the drawings to refer to the same or like parts.

In the description of the embodiments of the present invention, when the detailed description of the relevant known function or configuration is determined to unnecessarily obscure the important point of the present invention, the detailed description will be omitted. The terms used hereinafter are defined considering their functions in the embodiments of the present invention, and can be modified depending on intention of a person skilled in the art, practices, or the like. Therefore, the terms used herein should be understood not simply by the actual terms used but by the meaning lying within and the description disclosed herein.

Combinations of each block and each step of a flow chart in the accompanying drawings may be implemented by computer program instructions. Since the computer program instructions may be recorded in a general-purpose computer, a special computer or a processor of other programmable data processing equipment, instructions performed through the computers or the processor of the other programmable data processing equipment generate means for implementing functions described in each block of a drawing or each step of a flow chart. Since the computer program instructions may be stored in a computer usable or computer readable memory that may support the computer or other programmable data processing equipment to implement functions in a specific manner, the instructions stored in the computer usable or computer readable memory may generate product items that include instruction means for performing the functions described in each block of the drawing or each step of the flow chart. Since the computer program instructions may be loaded on the computer or other programmable data processing equipment, a series of operation steps are performed on the computer or the other programmable data processing equipment to generate processes implemented by the computer, whereby the instructions for performing the computer or the other programmable data processing equipment may provide steps for performing the functions described in each block of the drawing or each step of the flow chart.

Also, each block or each step may represent a part of modules, segments or codes, which include one or more executable instructions for executing specified logical function(s). In several replacement embodiments, it should be noted that functions mentioned in the blocks or steps may be generated by departing from the order. For example, two blocks or steps which are shown continually may be performed substantially at the same time, or may be performed in a reverse order depending on their functions.

FIG. 1 illustrates a high voltage direct current transmission (HVDC) system according to one embodiment of the present invention.

As shown in FIG. 1, the HVDC system 100 according to the embodiment of the present invention comprises an electric power generation part 101, an electric power transmission side alternating current part 110, an electric power transmission side electric power conversion part 103, a direct current electric power transmission part 140, an electric power receiving side electric power conversion part 105, an electric power receiving side alternating current part 170, an electric power receiving part 180, and a control part 190. The electric power transmission side electric power conversion part 103 comprises an electric power transmission side transformer part 120, and an electric power transmission side alternating current (abbreviated as "AC" hereinafter)-to-direct current (abbreviated as "DC" hereinafter)-converter part 130.

The electric power receiving side electric power conversion part 105 comprises a electric power receiving side DC-to-AC inverter part 150 and an electric power receiving side transformer part 160.

The electric power generation part 101 generates a 3-phases AC electric power. The electric power generation part 101 may comprise a plurality of electric power generation stations.

The electric power transmission side AC part 110 delivers the 3-phases AC electric power generated by the electric power generation part 101 to a DC conversion station that comprises a electric power transmission side transformer part 120 and an electric power transmission side AC-to-DC converter part 130.

The electric power transmission side transformer part 120 isolates the electric power transmission side AC part 110 from the electric power transmission side AC-to-DC converter part 130 and the DC electric power transmission part 140.

The electric power transmission side AC-to-DC converter part 130 converts a 3-phases AC electric power corresponding to the output of the electric power transmission side transformer part 120 to a DC electric power.

The DC electric power transmission part 140 delivers the DC electric power of the electric power transmission side to the electric power receiving side.

The electric power receiving side DC-to-AC inverter part 150 converts the DC electric power delivered by the DC electric power transmission part 140 to the 3-phases AC electric power.

The electric power receiving side transformer part 160 isolates the electric power receiving side AC part 170 from the electric power receiving side DC-to-AC inverter part 150 and the DC electric power transmission part 140.

The electric power receiving side AC part 170 provides the electric power receiving part 180 with the 3-phases AC electric power corresponding to the output of the electric power receiving side transformer part 160.

The control part 190 controls at least one of the electric power generation part 101, the electric power transmission side AC part 110, the electric power transmission side electric power conversion part 103, the DC electric power transmission part 140, the electric power receiving side electric power conversion part 105, the electric power receiving side AC part 170, the electric power receiving part 180, the control part 190, the electric power transmission station AC-to-DC converter part 130, and the electric power receiving side DC-to-AC inverter part 150. Particularly, the control part 190 may control turn-on timing and turn-off timing of a plurality of valves (in other words "thyristor valves") within the electric power transmission side AC-to-DC converter part 130 and the electric power receiving side DC-AC inverter part 150. Here, the valves may comprise a thyristors or an insulated gate bipolar transistors (IGBT).

Figure 2:
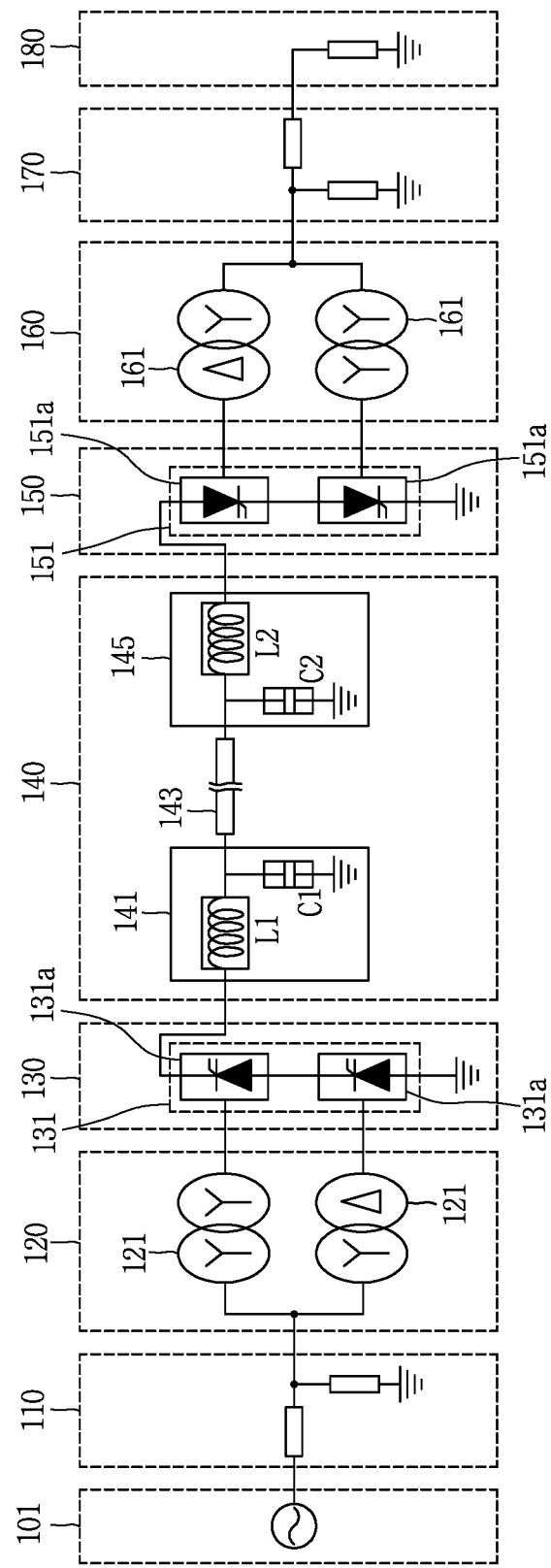
FIG. 2 illustrates configuration of a monopolar type HVDC system according to one embodiment of the present invention.

FIG. 2 illustrates a monopolar type HVDC system according to one embodiment of the present invention.

Particularly, FIG. 2 illustrates a system that transmits a DC electric power of a single pole. It is assumed that the single pole is, but not limited to, a positive pole in the following description.

The electric power transmission side AC part 110 comprises an AC electric power transmission line 111 and an AC filter 113.

The AC electric power transmission line 111 delivers a 3-phases AC electric power generated by the electric power generation part 101 to the electric power transmission side electric power conversion part 103.

The AC filter 113 removes a residual frequency component that is not used by the electric power conversion part 103 from the delivered 3-phases AC electric power.

The electric power transmission side transformer part 120 comprises one or more transformers 121 for the positive pole. For the positive pole, the electric power transmission side AC-to-DC converter part 130 comprises an AC-to-positive pole DC converter 131 to generate a positive pole DC electric power, and the AC-to-positive pole DC converter 131 comprises one or more 3-phases valve bridges 131a that respectively correspond to the transformers 121.

When one 3-phases valve bridge 131a is used, the AC-to-positive pole DC converter 131 can generate a positive pole DC electric power with 6 pulses by using the AC electric power. In this case, a primary coil and a secondary coil of the transformer 121 might have a wiring of a Y-Y shape or Y-delta (Δ) shape.

When two 3-phases valve bridges 131a are used, the AC-to-positive pole DC converter 131 can generate a positive pole DC electric power with 12 pulses by using the AC electric power. In this case, a primary coil ad a secondary coil of one of the transformers 121 might have a wiring of a Y-Y shape, and a primary coil and a secondary coil of the other transformer 121 might have a wiring of a Y-delta (Δ) shape.

When three 3-phases valve bridges 131a are used, the AC-to-positive pole DC converter 131 can generate a positive pole DC electric power with 18 pulses by using the AC electric power. The more pulses the positive pole DC electric power has, the lower the cost for the filter (in other words "the lower the purchase price of the filter') can be.

The DC electric power transmission part 140 comprises a electric power transmission side positive pole DC filter 141, a positive pole DC electric power transmission line 143, and an electric power receiving side positive pole DC filter 145.

The electric power transmission side positive pole DC filter 141 comprises an inductor L1 and a capacitor C1 and performs DC filtering of a positive pole DC electric power that is outputted by the AC-to-positive pole DC converter 131.

The positive pole DC electric power transmission line 143 has one DC line to transmit the positive pole DC electric power and an earth may be used as a current feedback path. One or more switches may be arranged on the DC line.

The electric power receiving side positive pole DC filter 145 comprises an inductor L2 and a capacitor C2 and performs DC filtering of the positive pole DC electric power that is delivered through the positive pole DC electric power transmission line 143.

The electric power receiving side DC-to-AC inverter part 150 comprises a positive pole DC-to-AC inverter 151, and the positive pole DC-to-AC inverter 151 comprises one or more 3-phases valve bridges 151a.

The electric power receiving side transformer part 160 comprises one or more transformers 161 that respectively correspond to the 3-phases valve bridges 151a for the positive pole.

When one 3-phases valve bridge 151a is used, the positive pole DC-to-AC inverter 151 can generate an AC electric power with 6 pulses by using the positive pole DC electric power. In this case, a primary coil ad a secondary coil of the transformer 161 might have a wiring of a Y-Y shape or Y-delta (Δ) shape.

When two 3-phases valve bridges 151a are used, the positive pole DC-to-AC inverter 151 can generate an AC electric power with 12 pulses using positive pole DC electric power. In this case, a primary coil ad a secondary coil of one of the transformers 161 might have a wiring of a Y-Y shape, and a primary coil ad a secondary coil of the other transformer 161 might have a wiring of a Y-delta (Δ) shape.

When three 3-phases valve bridges 151a are used, the positive pole DC-to-AC inverter 151 can generate an AC electric power with 18 pulses by using the positive pole DC electric power. The more pulses the AC electric power has, the lower the cost for the filter can be.

The electric power receiving side AC part 170 comprises an AC filter 171 and an AC electric power transmission line 173.

The AC filter 171 removes a residual frequency component except for the frequency component (for example, AC 60 Hz component) that the electric power receiving part 180 uses, from the AC electric power that is generated by the electric power receiving side electric power conversion part 105.

The AC electric power transmission line 173 delivers the filtered AC electric power to the electric power receiving part 180.

Figure 3:
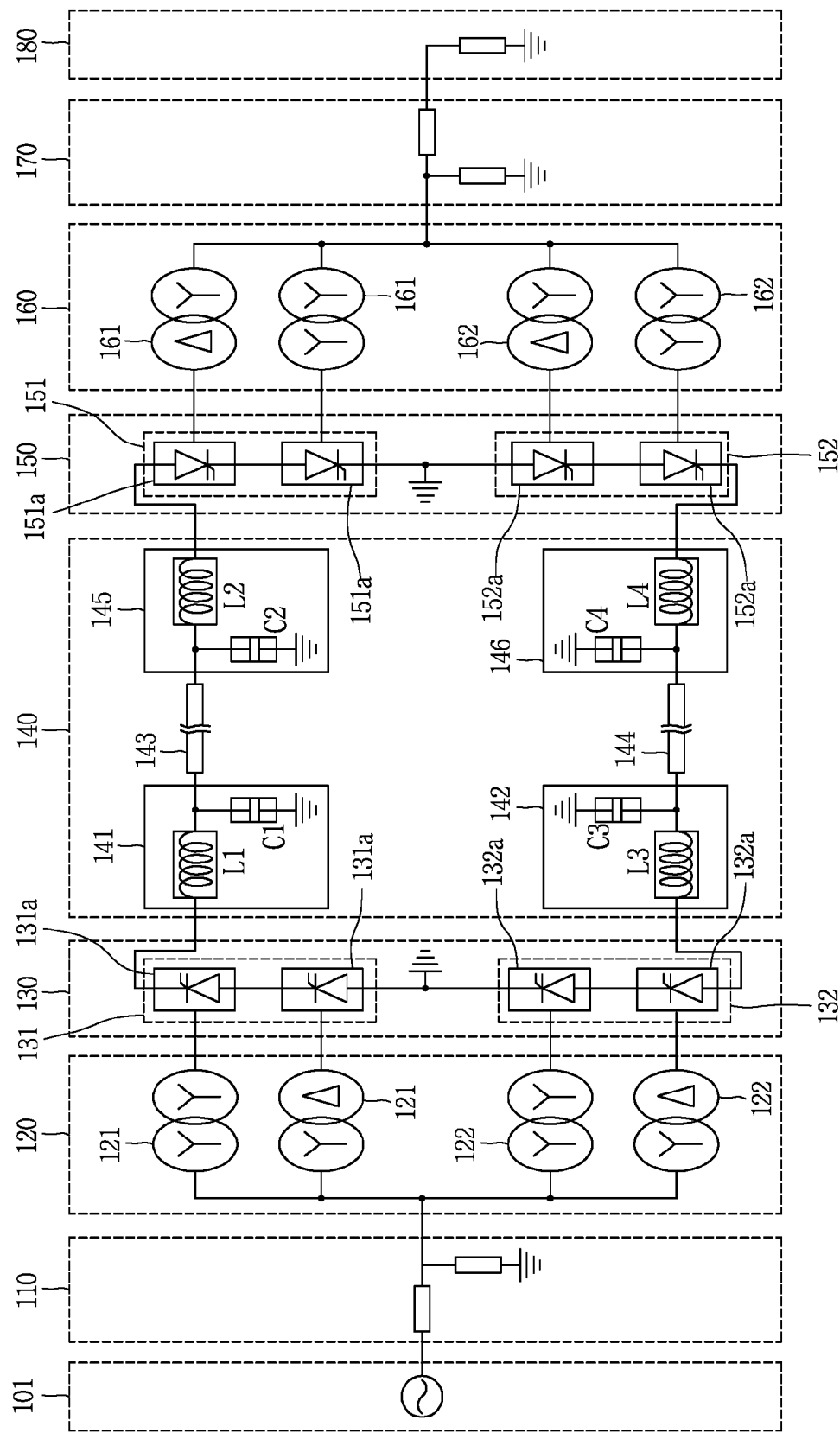
FIG. 3 illustrates configuration of a bipolar type HVDC system according to another embodiment of the present invention.

FIG. 3 illustrates a bipolar type HVDC system according to another embodiment of the present invention.

Particularly, FIG. 3 illustrates a system that transmits a DC electric power of two poles. It is assumed that the two poles are, but not limited to, a positive (+) pole and a negative (−) pole in the following description.

The electric power transmission side AC part 110 comprises an AC electric power transmission line 111 and an AC filter 113.

The AC electric power transmission line 111 delivers the 3-phases AC electric power generated by the electric power generation part 101 to the electric power transmission side electric power conversion part 103.

The AC filter 113 removes a residual frequency component that is not used by the electric power conversion part 103 from the delivered 3-phases AC electric power.

The electric power transmission side transformer part 120 comprises one or more transformers 121 for a positive pole and one or more transformers 122 for a negative pole. The electric power transmission side AC-to-DC converter part 130 comprises an AC-to-positive pole DC converter 131 to generate a positive pole DC electric power and an AC-to-positive pole DC converter 132 to generate a negative pole DC electric power. The AC-to-positive pole DC converter 131 comprises one or more 3-phases valve bridges 131a that respectively correspond to one or more transformers 121 for the positive pole, and the AC-to-negative pole DC converter 132 comprises one or more 3-phases valve bridges 132a that respectively correspond to one or more transformers 122 for the negative pole.

When one 3-phases valve bridge 131a is used for the positive pole, the AC-to-positive pole DC converter 131 can generate a positive pole DC electric power with 6 pulses by using the AC electric power. In this case, a primary coil ad a secondary coil of the transformer 121 might have a wiring of a Y-Y shape or Y-delta (Δ) shape.

When two 3-phases valve bridges 131a are used for the positive pole, the AC-to-positive pole DC converter 131 can generate a positive pole DC electric power with 12 pulses by using the AC electric power. In this case, a primary coil ad a secondary coil of one of the transformers 121 might have a wiring of a Y-Y shape, and a primary coil ad a secondary coil of the other transformer 121 might have a wiring of Y-delta (Δ) shape.

When three 3-phases valve bridges 131a are used for the positive pole, the AC-to-positive pole DC converter 131 can generate a positive pole DC electric power with 18 pulses by using the AC electric power. The more pulses the positive pole DC electric power has, the lower the cost for the filter (in other words "the lower the purchase price of the filter') can be.

When one 3-phases valve bridge 132a is used for the negative pole, the AC-to-positive pole DC converter 132 can generate a positive pole DC electric power with 6 pulses by using the AC electric power. In this case, a primary coil ad a secondary coil of the transformer 122 might have a wiring of a Y-Y shape or Y-delta (Δ) shape.

When two 3-phases valve bridges 132a are used for the negative pole, the AC-to-positive pole DC converter 132 can generate a positive pole DC electric power with 12 pulses by using the AC electric power. In this case, a primary coil ad a secondary coil of one of the transformers 122 might have a wiring of a Y-Y shape, and a primary coil ad a secondary coil of the other transformer 122 might have a wiring of a Y-delta (Δ) shape.

When three 3-phases valve bridges 132a are used for the negative pole, the AC-to-positive pole DC converter 132 can generate a positive pole DC electric power with 18 pulses by using the AC electric power. The more pulses the negative pole DC electric power has, the lower the price of the filter can be.

The DC electric power transmission part 140 comprises a electric power transmission side positive pole DC filter 141, an electric power transmission side negative pole DC filter 142, a positive pole DC electric power transmission line 143, a negative pole DC electric power transmission line 144, an electric power receiving side positive pole DC filter 145, and an electric power receiving side negative pole DC filter 146.

The electric power transmission side positive pole DC filter 141 comprises an inductor L1 and a capacitor C1 and performs DC filtering of the positive pole DC electric power that is outputted from the AC-to-positive pole DC converter 131.

The electric power transmission side negative pole DC filter 142 comprises an inductor L3 and a capacitor C3 and performs DC filtering of the negative pole DC electric power that is outputted from the AC-to-negative pole DC converter 132.

The positive pole DC electric power transmission line 143 has one DC line to transmit the positive pole DC electric power, and an earth may be used as a current feedback path. One or more switches can be arranged on the DC line.

The negative pole DC electric power transmission line 144 has one DC line to transmit the negative pole DC electric power, and a ground may be used as a current feedback passage. One or more switches can be arranged on the DC line.

The electric power receiving side positive pole DC filter 145 comprises an inductor L2 and a capacitor C2 and performs DC filtering of the positive pole DC electric power that is delivered through the positive pole DC electric power transmission line 143.

The electric power receiving side negative pole DC filter 146 comprises an inductor L4 and a capacitor C4 and performs DC filtering of the negative pole DC electric power that is delivered through the negative pole DC electric power transmission line 144.

The electric power receiving side DC-to-AC inverter part 150 comprises a positive pole DC-to-AC inverter 151 and a negative pole DC-to-AC inverter 152, the positive pole DC-to-AC inverter 151 comprises one or more 3-phases valve bridges 151*a*, and the negative pole DC-to-AC inverter 152 also comprises one or more 3-phases valve bridges 152*a*.

The electric power receiving side transformer part 160 comprises one or more transformers 161 for the positive pole, which respectively correspond to one or more 3-phases valve bridges 151*a*, and comprises one or more transformers 162 for the negative pole, which respectively correspond to one or more 3-phases valve bridges 152*a*.

When one 3-phases valve bridge 151*a* is used for the positive pole, the positive pole DC-AC inverter 151 can generate an AC electric power with 6 pulses by using the positive pole DC electric power. In this case, a primary coil ad a secondary coil of the transformer 161 might have a wiring of a Y-Y shape or Y-delta (Δ) shape.

When two 3-phases valve bridges 151*a* are used for the positive pole, the positive pole DC-AC inverter 151 can generate an AC electric power with 12 pulses by using the positive pole DC electric power. In this case, a primary coil ad a secondary coil of one of the transformers 161 might have a wiring of a Y-Y shape, and a primary coil ad a secondary coil of the other transformer 161 might have a wiring of a Y-delta (Δ) shape.

When three 3-phases valve bridges 151*a* are used for the positive pole, the positive pole DC-AC inverter 151 can generate an AC electric power with 18 pulses by using the positive pole DC electric power. The more pulses the AC electric power has, the lower the price for the filter can be.

When one 3-phases valve bridge 152*a* is used for the negative pole, the negative pole DC-AC inverter 152 can generate an AC electric power with 6 pulses by using the negative pole DC electric power. In this case, a primary coil ad a secondary coil of the transformer 162 might have a wiring of a Y-Y shape or Y-delta (Δ) shape.

When two 3-phases valve bridges 152*a* are used for the negative pole, the negative pole DC-AC inverter 152 can generate an AC electric power with 12 pulses by using the negative pole DC electric power. In this case, a primary coil ad a secondary coil of one of the transformers 162 might have a wiring of a Y-Y shape, and a primary coil ad a secondary coil of the other transformer 162 might have a wiring of a Y-delta (Δ) shape.

When three 3-phases valve bridges 152*a* are used for the negative pole, the negative pole DC-AC inverter 152 can generate an AC electric power with 18 pulses by using the negative pole DC electric power. The more pulses the AC electric power has, the lower the purchase price of the filter can be.

The electric power receiving side AC part 170 comprises an AC filter 171 and an AC electric power transmission line 173.

The AC filter 171 removes a residual frequency component except for the frequency component (for example, the frequency component of 60 Hz) that the electric power receiving part 180 uses, from the AC electric power that is generated by the electric power receiving side electric power conversion part 105.

The AC electric power transmission line 173 delivers the filtered AC electric power to the electric power receiving part 180.

Figure 4:
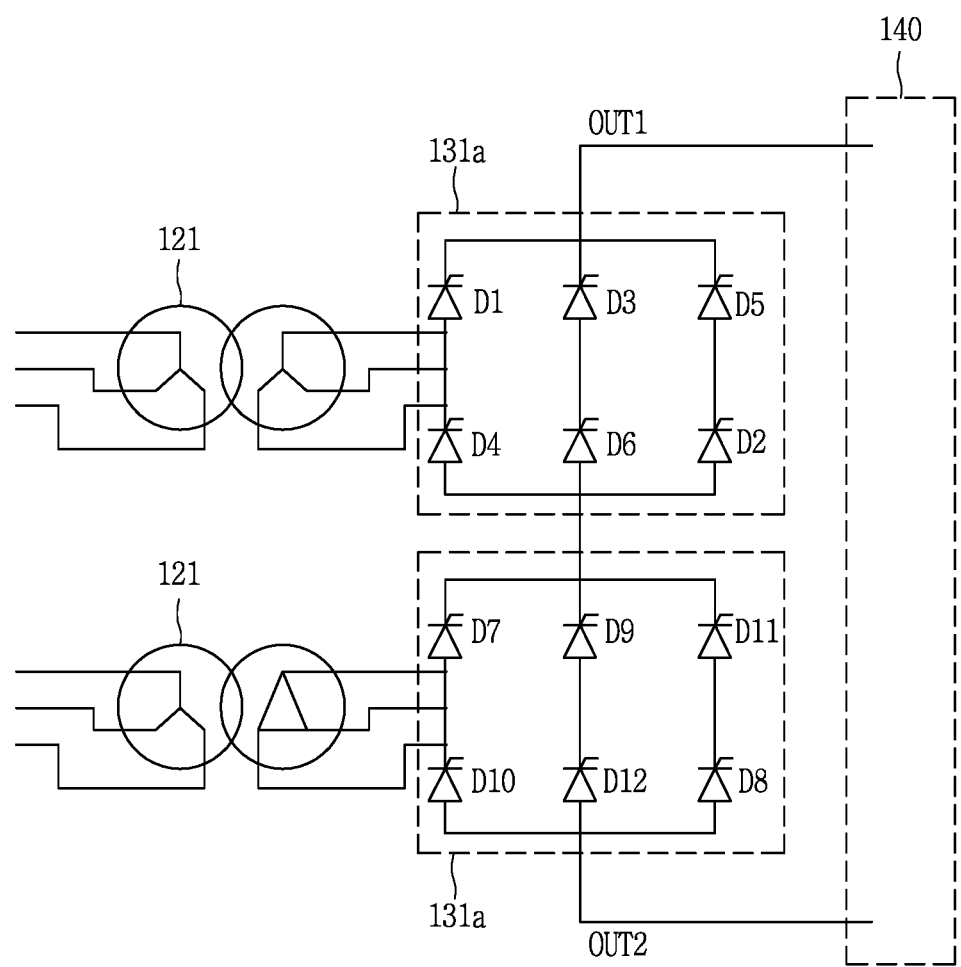
FIG. 4 illustrates a wiring of a transformer and a 3-phases valve bridge according to one embodiment of the present invention.

FIG. 4 illustrates a wiring of a transformer and a 3-phases valve bridge according to one embodiment of the present invention.

Particularly, FIG. 4 illustrates a wiring of two transformers 121 for the positive pole and two 3-phases valve bridges 131*a* for the positive pole. Since a wiring of two transformers 122 for the negative pole and two 3-phases valve bridges 132*a* for the negative pole, a wiring of two transformers 161 for the positive pole and two 3-phases valve bridges 151*a* for the positive pole, a wiring of two transformers 162 for the negative pole and two 3-phases valve bridges 152*a* for the negative pole, a wiring of one transformer 121 for the positive pole and one 3-phases valve bridge 131*a* for the positive pole, a wiring of one transformer 161 for the positive pole and one 3-phases valve bridge 151*a* for the positive pole, etc. can easily be derived from the embodiment of the present invention as shown in FIG. 4, those figures and descriptions will be omitted.

In FIG. 4, the transformer 121 that has a wiring of a Y-Y shape is denoted as the upper side transformer, the transformer 121 that has a wiring a Y-delta shape as the lower side transformer, the 3-phases valve bridge 131*a* connected to the upper side transformer as the upper 3-phases valve bridge, and the 3-phases valve bridge 131*a* connected to the lower side transformer as the lower 3-phases valve bridge.

The upper 3-phases valve bridge and the lower 3-phases valve bridge have two output terminals, the first output terminal OUT1 and the second output terminal OUT2, that output a DC electric power.

The upper 3-phases valve bridge comprises 6 valves D1 to D6, and the lower 3-phases valve bridge comprises 6 valves D7 to D12.

The valve D1 has a cathode connected to the first output terminal OUT1 and an anode connected to a first terminal of a secondary coil of the upper transformer.

The valve D2 has a cathode connected to an anode of the valve D5 and an anode connected to an anode of the valve D6.

The valve D3 has a cathode connected to the first output terminal OUT1 and an anode connected to a second terminal of the secondary coil of the upper transformer.

The valve D4 has a cathode connected to the anode of the valve D1 and an anode connected to the anode of the valve D6.

The valve D5 has a cathode connected to the first output terminal OUT1 and an anode connected to a third terminal of the secondary coil of the upper transformer.

The valve D6 has a cathode connected to the anode of the valve D3.

The valve D7 has a cathode connected to the anode of the valve D6 and an anode connected to a first terminal of a secondary coil of the lower transformer.

The valve D8 has a cathode connected to an anode of the valve D11 and an anode connected to the second output terminal OUT2.

The valve D9 has a cathode connected to the anode of the valve D6 and an anode connected to a second terminal of the secondary coil of the lower transformer.

The valve D10 has a cathode connected to the anode of the valve D7 and an anode connected to the second output terminal OUT2.

The valve D11 has a cathode connected to the anode of the valve D6 and an anode connected to a third terminal of the secondary coil of the lower transformer.

The valve D12 has a cathode connected to the anode of the valve D9 and an anode connected to the second output terminal OUT2.

Meanwhile, the electric power receiving side DC-to-AC inverter part 150 can be configured by a modular multi-level inverter 200.

The modular multi-level inverter 200 can transform a DC electric power into an AC electric power by using a plurality of sub-modules 210.

A configuration of the modular multi-level inverter 200 will be described with reference to FIGS. 5 and 6.

Figure 5:
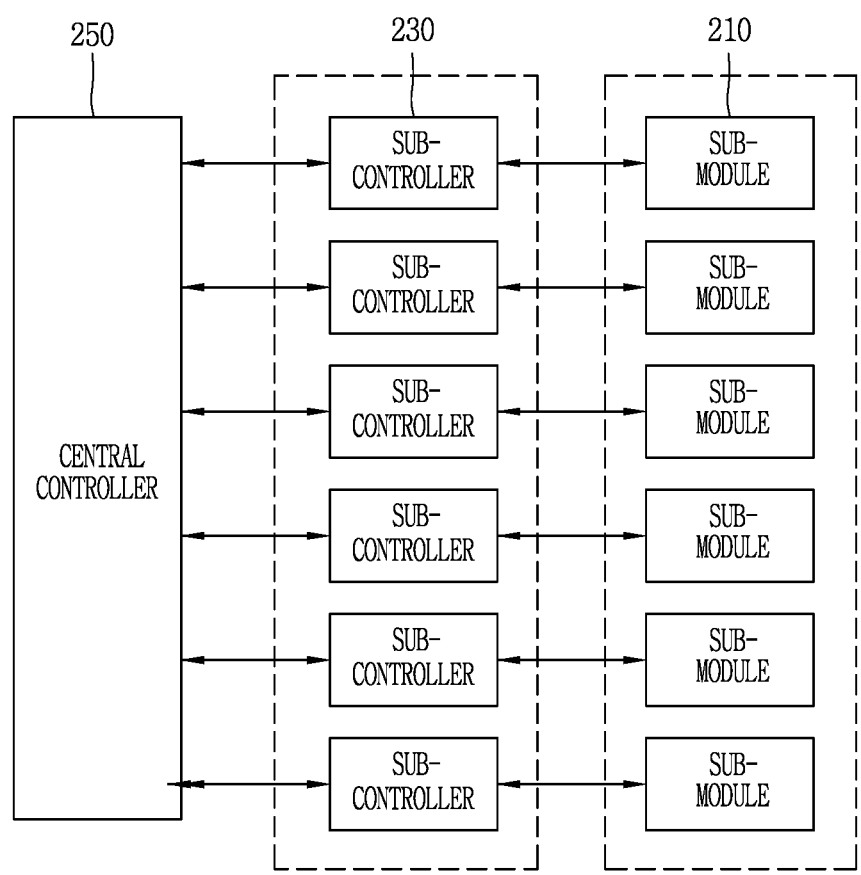
FIG. 5 is a block diagram illustrating configuration of a modular multi-level converter according to one embodiment of the present invention.
Figure 6:
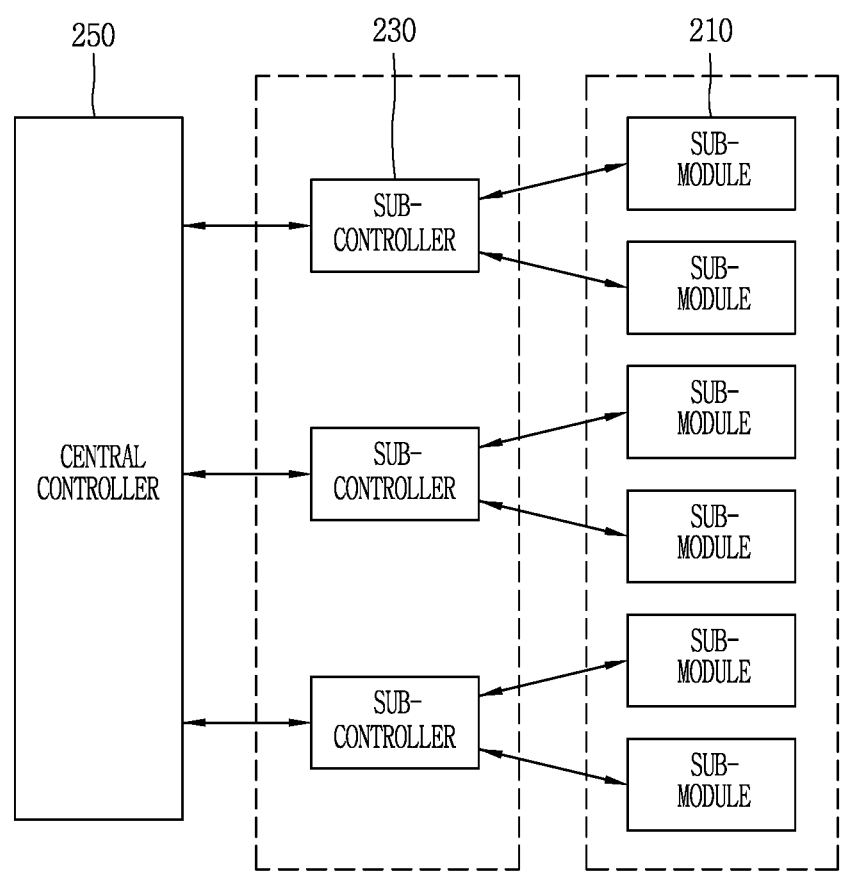
FIG. 6 is a block diagram illustrating configuration of a modular multi-level converter according to another embodiment of the present invention.

FIGS. 5 and 6 are schematic block diagrams of the modular multi-level inverter 200.

The modular multi-level inverter 200 comprises a central controller 250, a plurality of sub-controllers 230, and a plurality of sub-modules 210.

The central controller 250 controls the plurality of sub-controller 230, each of which controls a corresponding sub-module that is connected to each sub-controller 230.

At that time, as shown in FIG. 5, one sub-controller 230 is connected to one sub-module 210 and therefore can control a switching operation of the sub-module 210 that is connected to itself, based on a control signal that is transmitted from the central controller 250.

Also, on the other hand, one sub-controller 230 is connected to the plurality of sub-modules 210 as shown in FIG. 6 to identify each control signal of the plurality of sub-modules 210 that are connected thereto, by using a plurality of control signals that are transmitted from the central controller 250, and therefore control the plurality of sub-modules 210, respectively, based on the identified control signals.

The central controller 250 determines an operation condition of the plurality of sub-modules 210 and generates control signals to control operations of the plurality of sub-modules 210 in accordance with the determined operation condition.

And, when the control signal is generated, the central controller 250 delivers the generated control signal to the sub-controller 230.

At this time, an address is assigned to each of sub-modules 210, whereby the central controller 250 generates a control signal for each sub-module 210 and delivers the generated control signal to the sub-controller 230 on the basis of the assigned address.

For example, the first sub-module 210 and the first sub-controller 230 are connected to each other, whereby switching control of the first sub-module 210 is performed through the first sub-controller 230, and if address information assigned to the first sub-module 210 is '1', the central controller 250 transmits the control signal corresponding to the first sub-module 210 to which the address of '1' is assigned.

And, the first sub-controller 230 receives the control signal transmitted from the central controller 250 and controls the sub-module 210 connected thereto in accordance with the received control signal.

At this time, the control signal transmitted from the central controller 250 to the sub-controller 230 can comprise switching condition information of the sub-module 210 and identification information indicating to which sub-module 210 the switching condition information applies.

Therefore, using the identification information included in the control signal, the sub-controller 230 identifies whether the control signal transmitted from the central controller 250 is the control signal corresponding to the sub-module connected thereto and therefore can control a switching of the sub-module based on the switching condition information included in the control signal.

At this time, if the identification information included in the received control signal does not correspond to the sub-module 210 connected to the sub-controller 230, the sub-controller 230 does not apply the switching operation based on the received control signal to the sub-module 210.

And, the sub-controller 230 delivers the received control signal to another sub-controller that controls the sub-module corresponding to the identification information included in the control signal.

Hereinafter, the sub-module 210, the sub-controller 230, and the central controller 250 will be described in more detail.

The sub-module 210 receives an input of a DC electric power and can perform any one of charge, discharge, and bypass operations.

The sub-module 210 comprises a switching device, a diode and capacitor, therefore as switching operation and rectification operation of the diode, it can perform any one of charge, discharge, and bypass operations.

Each of the sub-controllers 230 obtains information on the sub-module 210 and inserts the obtained information into the address information. And, each of the sub-controllers 230 transmits the address information, to which the obtained information is inserted, to the central controller 250 in response to a request of the central controller 250.

To this end, each of the sub-controllers 230 can have at least one sensor. The sensor included in the sub-controller 230 can measure at least one of a current and a voltage of the sub-module 210.

The sub-controller 230 can insert at least one information of the measured current and voltage information of the sub-module 210 into the address information. At this time, the measured information can be voltage information charged in the sub-module 210.

Also, the sub-controller 230 can insert reference information transmitted from the central controller 250 into the address information. The reference information can comprise a reference DC voltage and a switching carrier signal.

Also, the sub-controller 230 can store switching history information of the sub-module 210 in the address information. The switching history information represents the history information on charge operation, discharge operation, and bypass operation that are performed by the sub-module 210.

In other words, the sub-controller 230 identifies current switching information on the sub-module 210 and switching information performed previously and inserts the identified switching information into the address information.

Also, an address is assigned to each of the sub-modules 210 and therefore the address information can comprise identification information corresponding to the assigned address.

And, when the sub-controller 230 receives a signal requesting identification of its own address from the central controller 250, the sub-controller 230 transmits the address information to the central controller 250 in response to the received request signal.

At this time, the transmitted address information comprises not only the identification information described as above but also various kinds of information related to the sub-module 210.

The central controller 250, just with identification of the address, can even identify status information of the sub-module 210 controlled by the sub-controller 230.

For example, a plurality of sub-modules 210 are provided, and therefore some of the sub-modules 210 can only perform a continuing charge operation, and the other sub-modules 210 can only perform a discharge operation or bypass operation. Therefore, the central controller 250, using the switching history information included in the identified address information, determines sub-modules performing discharge operations at the current time, sub-modules performing charge operations, and sub-modules performing bypass operations, respectively.

Also, the central controller 250, using charged voltage information included in the address information, can determine the number of sub-modules 210 that perform discharge operations based on the electric power needed at the current time.

In other words, the central controller 250 can control overall operations of the modular multi-level inverter 200.

The central controller 250 can measure the current and voltage of the AC parts 110 and 170 associated thereto and the DC electric power transmission part 140.

Also, the central controller 250 can calculate a total control value. In this case, the total control value can be a target value of a voltage, a current and a frequency size of an output AC electric power of the modular multi-level inverter 200.

The central controller 250 can calculate the total control value based on one or more of the current and voltage of the AC parts 110 and 170 associated to the modular multi-level inverter 200 and the current and voltage of the DC electric power transmission part 140.

Meanwhile, the central controller 250 can control the operation of the modular multi-level inverter 200 based on one or more of a base active electric power, a base reactive electric power, a reference current, and a reference voltage, which are received from a supervisory controller (not shown) through a communication device (not shown).

The central controller 250 can transmit and receive data to and from the sub-controller 230 and therefore can receive the address information described as above.

Connection of the plurality of sub-modules 210 included in the modular multi-level inverter 200 will be described with reference to FIG. 7.

Figure 7:
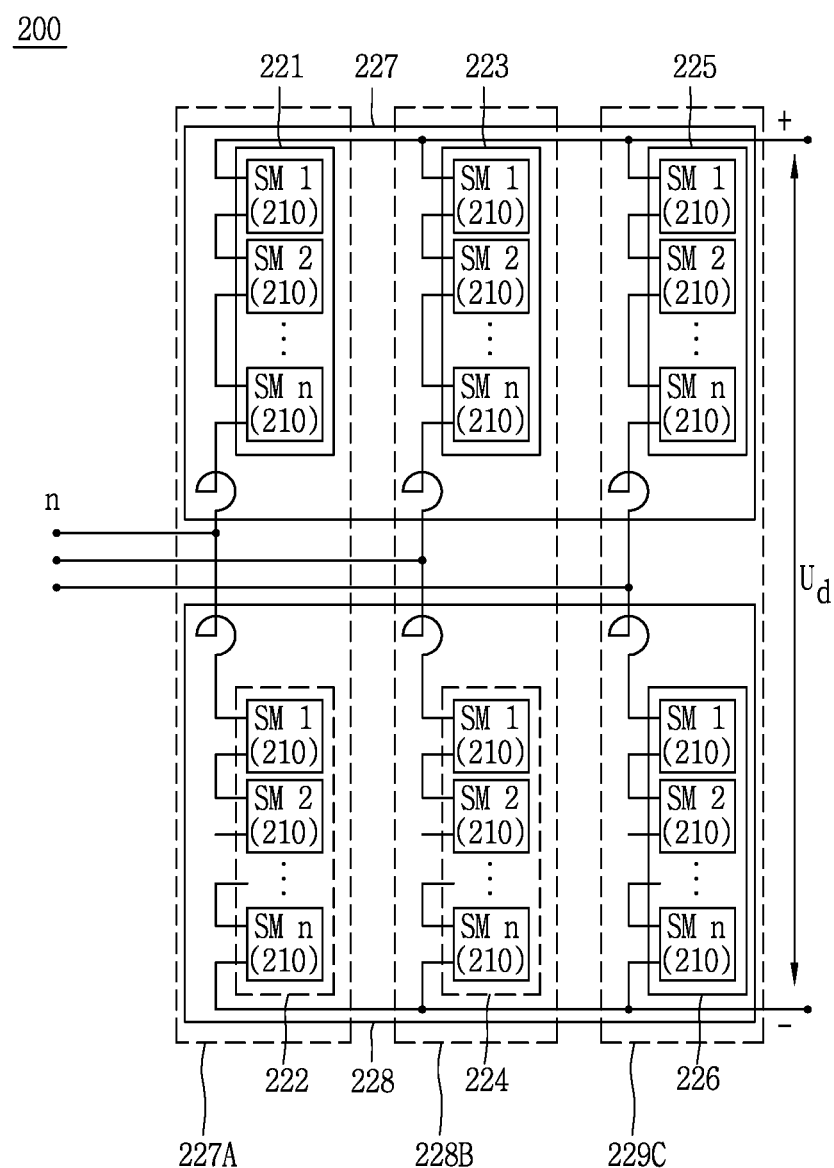
FIG. 7 illustrates connection of a plurality of sub-modules according to one embodiment of the present invention.

FIG. 7 illustrates connection of the plurality of sub-modules 210 included in a 3-phases modular multi-level inverter 200.

Referring to FIG. 7, the plurality of sub-modules 210 can be connected in series, and the plurality of sub-modules 210 connected to the positive pole or the negative pole for one phase can form one arm.

In general, the 3-phases modular multi-level inverter 200 comprises 6 arms, since each of 3 phases, A, B, and C comprises the positive pole and the negative pole.

Therefore, the 3-phases modular multi-level inverter 200 comprises a first arm 221 configured with a plurality of sub-modules 210 for the positive pole of A-phase, a second arm 222 configured with a plurality of sub-modules 210 for the negative pole of A-phase, a third arm 223 configured with a plurality of sub-modules 210 for the positive pole of B-phase, a fourth arm 224 configured with a plurality of sub-modules 210 for the negative pole of B-phase, a fifth arm 225 configured with a plurality of sub-modules 210 for the positive pole of C-phase, and a sixth arm 226 configured with a plurality of sub-modules 210 for the negative pole of C-phase.

And, a plurality of sub-modules 210 for one phase may form a leg.

Therefore, the 3-phases modular multi-level inverter 200 may comprise a A-phase leg 227A including a plurality of sub-modules 210 for the A-phase, a B-phase leg 228B including a plurality of sub-modules 210 for the B-phase, and a C-phase leg 229C including a plurality of sub-modules 210 for the C-phase.

Therefore, the first arm 221 to the sixth arm 226 are included in the A-phase leg 227A, the B-phase leg 228B, and the C-phase leg 229C, respectively.

In more detail, the first arm 221 which is a positive pole arm for A-phase and the second arm 222 which is the negative pole arm for A-phase are included in the A-phase leg 227A, and the third arm 223 which is the positive pole arm for B-phase and the fourth arm 224 which is the negative pole arm for B-phase are included in the B-phase leg 228B. Also, the fifth arm 225 which is the positive pole arm for C-phase and the sixth arm 226 which is the negative pole arm for C-phase are included in the C-phase leg 229C.

Also, the plurality of sub-modules 210 may form the positive pole arm 227 and the negative pole arm 228 depending on polarity.

In more detail, referring to FIG. 7, the plurality of sub-modules 210 included in the modular multi-level inverter 200 may be divided into a plurality of sub-modules 210 corresponding to the positive pole and a plurality of sub-modules 210 corresponding to the negative pole based on a neutral line (n).

Therefore, the modular multi-level inverter 200 may comprise the positive pole arm 227 including a plurality of sub-modules 210 for the positive pole and the negative pole arm 228 including a plurality of sub-modules 210 for the negative pole.

Therefore, the positive pole arm 227 may comprise the first arm 221, the third arm 223, and the fifth arm 225, and the negative pole arm 228 may comprise the second arm 222, the fourth arm 224, and the sixth arm 226.

Next, a configuration of the sub-module 210 will be described with reference to FIG. 8.

Figure 8:
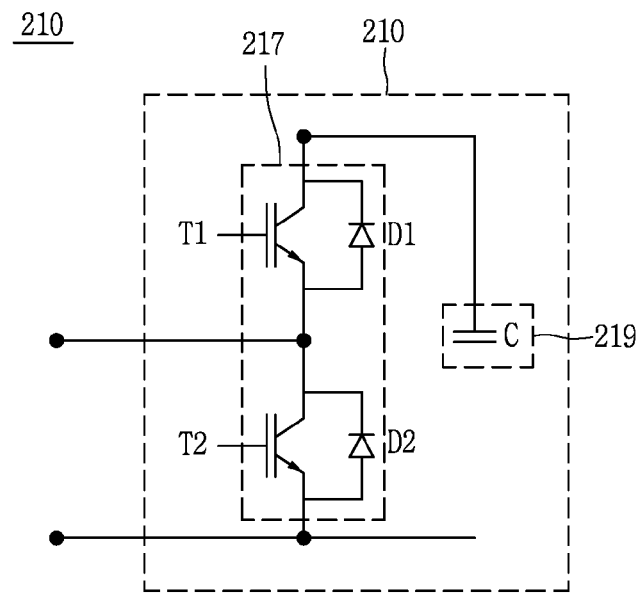
FIG. 8 is an exemplary view illustrating a configuration of sub-modules according to one embodiment of the present invention.

FIG. 8 is an exemplary view illustrating the configuration of the sub-module 210.

Referring to FIG. 8, the sub-module 210 comprises two switches T1 and T2 and two diodes D1 and D2 in a switching part 217, and a storage part 219. This type of sub-module is also referred to as a half-bridge type or half bridge inverter.

In this case, the switches T1 and T2 included in the switching part 217 may comprise an electric power semiconductor. The electric power semiconductor is a semiconductor device for an electric power device such as an inverter and can be optimized for conversion or control of the electric power. And, the electric power semiconductor is also referred to as a valve device.

Since each of the switches T1 and T2 included in the switching part 217 may comprise the electric power semiconductor, it may be configured with an Insulated Gate Bipolar Transistor (abbreviated as IGBT), a Gate Turn-off Thyristor (abbreviated as GTO), an Integrated Gate Commutated Thyristor (abbreviated as IGCT), etc.

The storage part 219 comprises a capacitor and thus charge or discharge electric energy. Meanwhile, the sub-module may be represented as an equivalent model on the basis of the configuration and operation of the sub-module 210.

Figure 9:
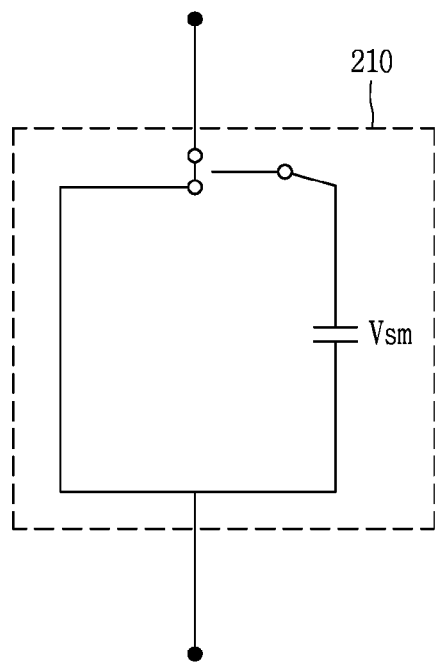
FIG. 9 illustrates an equivalent model of sub-modules according to one embodiment of the present invention.

FIG. 9 illustrates an equivalent model of the sub-module 210. Referring to FIG. 9, the sub-module 210 may be represented as an electric energy charging and discharging device that comprises a switch and a capacitor.

Therefore, it is noted that the sub-module 210 is the same as the electric energy charging and discharging device of which output voltage is Vsm.

Next, the operation of the sub-module 210 will be described with reference to FIGS. 10 to 13.

The switching part 217 of the sub-module 210 in FIGS. 10 to 13 comprises a plurality of switches T1 and T2, each of which is connected diodes D1 and D2, respectively. A storage part of the sub-module 210 comprises a capacitor C.

The charging and discharging operation of the sub-module 210 will be described with reference to FIGS. 10 and 11.

Figure 10:
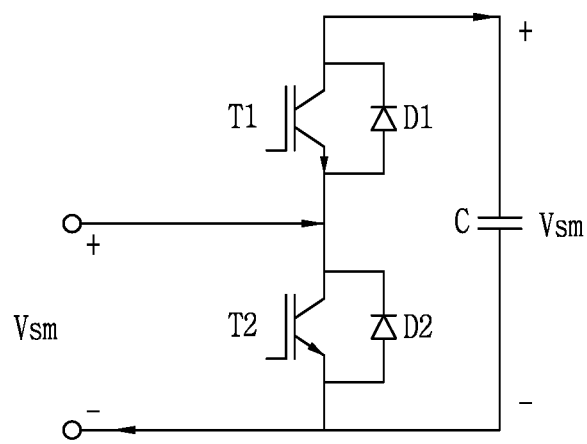
FIGS. 10 to 13 illustrate an operation of sub-modules according to one embodiment of the present invention.
Figure 11:
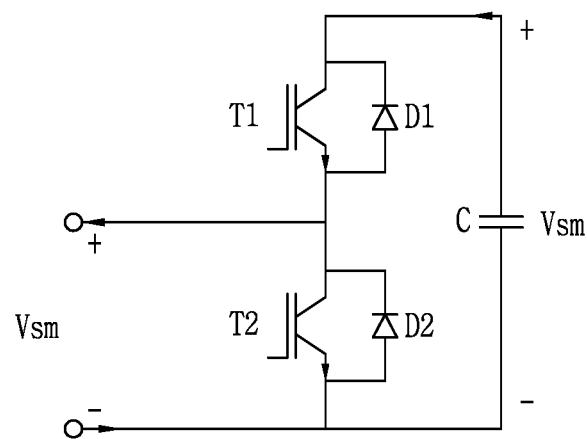

FIGS. 10 and 11 illustrates formation of a capacitor voltage Vsm of the sub-module 210.

Referring to FIG. 10, the two switches T1 and T2 of the switching part 217 represent a turn-off state. And referring to FIG. 11, the switch T1 of the switching part 217 represents a turn-on state and the switch T2 represents a turn-off state. Therefore, the sub-module 210 may form the capacitor voltage in accordance with the operation of each switch.

In more detail, referring to FIG. 10, a current flowing into the sub-module 210 passes through the diode D1, is delivered to the capacitor C, and forms the capacitor voltage (that is Vsm). And the formed capacitor voltage can charge electric energy in the capacitor C.

And, the sub-module 210 can perform a discharging operation for discharging charged energy.

In more detail, referring to FIG. 11, storage energy of the capacitor, which is charged in the sub-module 210 is output through the switch T1. Therefore, the sub-module 210 may discharge the stored energy.

A bypass operation of the sub-module 210 will be described with reference to FIGS. 12 and 13.

Figure 12:
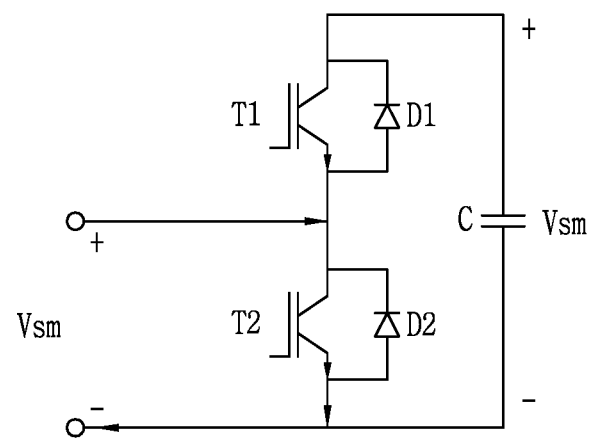
Figure 13:
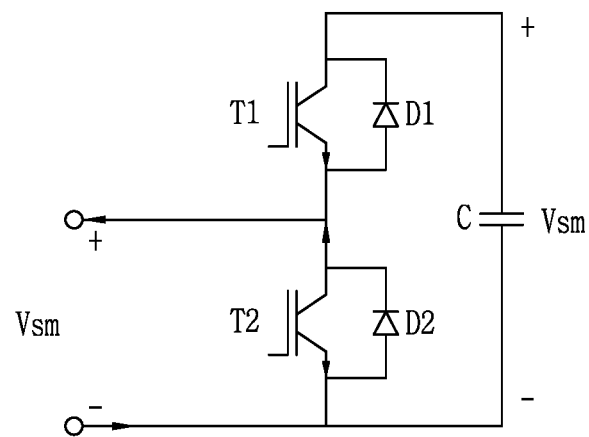

FIGS. 12 and 13 illustrate a formation of a zero voltage of the sub-module 210.

Referring to FIG. 12, the switch T1 of the switching part 217 represents a turn-off state and the switch T2 represents a turn-on state. And referring to FIG. 13, both of the switches T1 and T2 of the switching part 217 represent turn-off state.

Since a current does not flow in the capacitor C of the sub-module 210, the sub-module 210 can form a zero voltage.

In more detail, referring to FIG. 12, the current flowing into the sub-module 210 is output through the switch T2, whereby the sub-module 210 can form a zero voltage.

And, referring to FIG. 13, the current flowing into the sub-module 210 is output through the diode D2, whereby the sub-module 210 can form a zero voltage.

As describe above, since the sub-module 210 can form a zero voltage, it can perform the bypass operation that just passes through the current without flowing into the sub-module 210.

Figure 14:
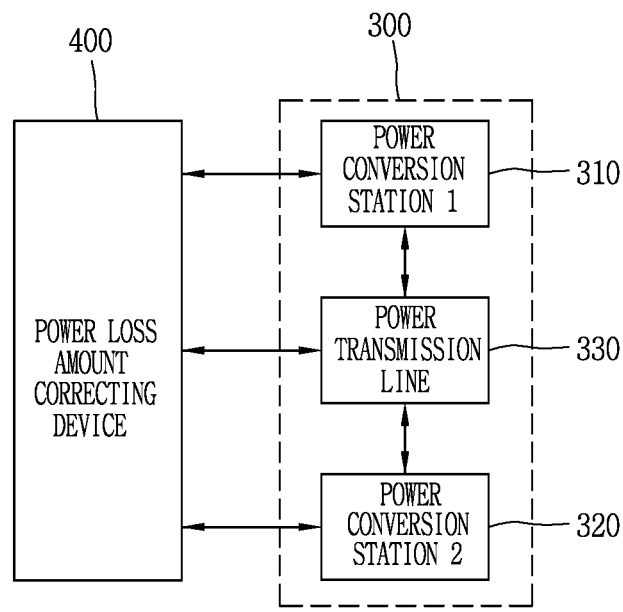
FIG. 14 is a block diagram illustrating a configuration of an electric power loss correcting system according to the embodiment of the present invention.

FIG. 14 is a schematic block diagram illustrating a configuration of a electric power loss correcting system according to the embodiment of the present invention.

Referring to FIG. 14, an electric power loss correcting system comprises an HVDC system 300 and an electric power loss amount correcting device 400.

Since the HDVC system 300 has been described as above, its detailed description will be omitted.

As describe above, the HDVC system 300 comprises a first conversion station 310, a second conversion station 320, and an electric power transmission line 330.

The first conversion station 310 and the second conversion station 320 are operated as either a electric power transmission station or an electric power receiving station, depending on operation conditions. For example, in the case that the first conversion station 310 is operated as the electric power transmission station, the second conversion station 320 is operated as the electric power receiving station that receives an electric power transmitted from the first conversion station 310. On the contrary, in the case that the second conversion station 320 is operated as the electric power transmission station, the first conversion station 310 is operated as the electric power receiving station that receives an electric power transmitted from the second conversion station 320.

The electric power transmission line 300 is arranged between the first conversion station 310 and the second conversion station 320, whereby the electric power transmission line 300 can transmit the electric power generated by the first conversion station 310 to the second conversion station 320 and on the contrary it can transmit the electric power generated by the second conversion station 320 to the first conversion station 310.

The electric power loss amount correcting device 400 may be installed in the first conversion station 310 or the second conversion station 320 or the third place. The electric power loss amount correcting device 400 calculates the amount of electric power loss generated in the first conversion station 310, the second conversion station 320, and the electric power transmission line 330, respectively, verifies the calculated amount of electric power loss based on an impedance value, and corrects the calculated mount of electric power loss in accordance with the result of the verification.

Such correcting of the amount of electric power loss may be performed for the first conversion station 310, the second conversion station 320, and the electric power transmission line 330, respectively. Also, correcting of the amount of electric power loss may be separately achieved depending on operation mode and required amount of electric power for the first conversion station 310, the second conversion station 320, and the electric power transmission line 330.

For example, the electric power loss amount correcting device 400 separately corrects the amount of electric power loss depending on the required amount of electric power in the condition where the first conversion station 310 is operated as the electric power transmission station and the second conversion station 320 is operated as the electric power receiving station for the amount of required electric power. Also, the electric power loss amount correcting device 400 separately corrects the amount of electric power loss depending on the required amount of electric power in the condition where the first conversion station 310 is operated as the electric power receiving station and the second conversion station 320 is operated as the electric power transmission station.

The conventional calculation method for the amount of electric power loss uses a difference value subtracting the amount of receiving electric power (measured value of a voltage sensor installed in the electric power receiving station×measured value of a current sensor installed in the electric power receiving station) from the amount of transmission electric power (measured value of a voltage sensor installed in the electric power transmission station×measured value of a current sensor installed in the electric power transmission station).

However, the actual HDVD system comprises a valve for performing electric power conversion, a transformer, a filter, and a controller, and therefore switching loss and harmonic noise are generated.

Since the HVDC system should perform harmonic suppress, smoothing of current and voltage, and phase control, it comprises a harmonic filter including a coil and a capacitor, a smoothing reactor, a neutral line capacitor, and a saturation reactor.

Such passive devices performing filtering functions as above have an impedance value (resistance of imaginary number part) depending on frequency, which is constantly changed. The impedance is constantly changed when the amount of electric power loss is measured.

Impedance means resistance and comprises a real number part and an imaginary number part. Strictly speaking, an unchanged real number part of impedance is called resistance. And, the imaginary number part means resistance changed mainly depending on frequency.

The more detailed description on impendence is as follows.

Impedance means combined resistance of an AC circuit where a resistor, coils, and a condenser are connected in a series. Impedance is the amount of vector indicating not only a voltage to current ratio but also a phase. And, a complex number of impedance Z is expressed as R+ix (i is an imaginary unit), where a real number part R is a resistance value and an imaginary number part x is reactance.

In this case, electric resistance is a voltage to current ratio in a DC circuit. However, since a phase of voltage and current is changed due to coils and condenser in an AC circuit, resistance values and the phase are expressed using complex impedance.

The current passing through resistance is in the same phase as that of the voltage. The phase of the voltage is ahead in comparison with that of the current by 90 degree (¼ cycle) when the current flows in coils. And the voltage is lag behind the current by 90 degree in the condenser. Therefore, a phaseδafter passing through a resistor, coils, and a condenser can be expressed as follows: it becomes an angle of a complex impedance.

$$\tan\delta = \frac{|V_L + V_C|}{|V_R|} = \frac{(X_L + X_C)}{R}$$

And, impedance Z is a resistance value in a DC and its size is calculated as shown below.

$$Z=\sqrt{(R^2+X^2)}=\sqrt{(R^2+(X_L-X_C)^2)}$$

In this case, R is a resistance and $X=X_L-X_C$ is a total reactance.

X is a positive value for inductive reactance and X is a negative value for capacitive reactance.

And, impedance of a circuit connected in a series is a sum of each components and a reciprocal of impedance of a circuit connected in parallel is a sum of a reciprocal of each impedance.

$$Z_{series}=Z_1+Z_2=(R_1+R_2)+i(X_1+X_2)$$

$$(Z_{parallel})^{-1}=Z_1^{-1}+Z_2^{-1}$$

Regarding an alternation current, since its impedance value is changed depending on time, an effect values of current and voltage are used. Therefore, if an effective value of an AC voltage is Ve, an effective value of the current (Ie) is equal to Ve/Z: Ie=Ve/Z.

Therefore, when electric power transmission is assumed to be constant and harmonic is not generated, an impedance value previously set at the time of system design becomes a fixed value.

However, in the HVDC system, constant electric power conversion to AC-to-DC or DC-to-AC is made, harmonic is constantly generated due to a switching means called a valve (in other words "thyristor valve") and harmonic enters the HVDC system in accordance with grid tying, and there is a harmonic filter to get rid of such harmonic. Therefore, the impedance value is constantly changed when electric power loss is calculated and the amount of electric power loss is constantly changed, accordingly.

Therefore, the electric power loss amount correcting device 400 calculates impedance values of the first conversion station 310, the second conversion station 320, and the electric power transmission line 330, verifies and corrects the amount of electric power loss that is generated in each of positions when the HDVC system is operated. For such calculation, verification, and correcting, the electric power loss amount correcting device 400 may comprise at least one microprocessor or microcomputer.

To this end, the electric power loss amount correcting device 400 calculates a first electric power loss amount.

The first electric power loss amount is calculated simply using the conventional method for calculating the amount of electric power loss.

In other words, the first electric power loss amount can be calculated as follows.

The first electric power loss amount=the amount of transmission electric power ($V\_1 \times I\_1$)−the amount of receiving electric power ($V\_2 \times I\_2$), where the V_1 and I_1 are the values of voltage and current, respectively, obtained by the voltage sensor and the current sensor installed in the conversion station operating as an electric power transmission station, the V_2 and I_2 are the values of voltage and current, respectively, obtained by the voltage sensor and the current sensor installed in the conversion station operated as an electric power receiving station.

Such values of voltage and current can be transmitted from the conversion stations to the electric power loss amount correcting device 400 through communication means including wired communication means or wireless communication means or mobile communication means.

Once the first electric power loss amount is calculated, the electric power loss amount correcting device 400 verifies if the calculated the first electric power loss amount is an accurate value, and corrects its error if the first electric power loss amount is not an accurate value.

For the verification, the electric power loss amount correcting device 400 calculates the amount of loss generated in the first conversion station 310, the amount of loss generated in the second conversion station 320, and the amount of loss generated in the electric power transmission line 220, respectively, and, based on them, calculates a second electric power loss amount.

In other words, the second electric power loss amount can be calculated using the following equation.

The second electric power loss amount=the amount of loss in the first conversion station+the amount of loss in the second conversion station+the amount of loss in the electric power transmission line, where the amount of loss in the first conversion station is calculated by $I\_1 \times I\_1 \times Z1$ and the Z1 is an impedance value of the first conversion station.

Also, the amount of loss in the second conversion station is calculated by $I\_2 \times I\_2 \times Z2$ and the Z2 is an impedance value of the second conversion station.

Also, the amount of loss in the electric power transmission line is calculated by $I\_3 \times I\_3 \times Z3$, the I_3 is a current value of the electric power transmission line and the Z3 is an impedance value of the electric power transmission line.

Based on the calculations, the amount of loss generated in each equipment (first conversion station, second conversion station, and electric power transmission line) can be achieved.

The second electric power loss amount may be the actual electric power loss amount generated in the HVDC system. More specifically, the second electric power loss amount may be the accurate loss amount measured in the HVDC system.

At this time, it would be ideal if the first electric power loss amount is substantially the same as the second electric power loss amount. However, as described above, since the loss amount is constantly changed due to switching loss, heat loss, harmonic loss at the time of electric power conversion, it would be difficult that the first electric power loss amount is the same as the second electric power loss amount.

Therefore, in the embodiment of the present invention, a correcting process is performed constantly to correct an error between the first electric power loss amount and the second electric power loss amount.

That is, as described above, it would be ideal if the difference between the first electric power loss amount and the second electric power loss amount is zero, this is rarely the case, however. Therefore, when the difference between the first electric power loss amount and the second electric power loss amount is x, correcting can be performed as much as the x value for the electric power amount of the electric power receiving station.

For example, in the case where the electric power is transmitted from the first conversion station to the second conversion station (in the case where the first conversion station is operated as a electric power transmission station and the second conversion station is operated as a electric power receiving station) under 30 Mega Watt (MW) operation condition, if the resulting value of subtracting the second electric power loss amount from the first electric power loss amount is equal to 1 MW, the difference value of 1 MW can be corrected for the electric power measured in the electric power receiving station as much as an offset value (in order words, compensation value), whereby correcting can be performed. For example, if the amount of electric power measured in the second conversion station which is the electric power receiving station is 28 MW, the amount of electric power in the second conversion station may be recognized as 29 MW by applying the offset value.

However, even if the HVDC system is operated again in the same condition and the loss amount is calculated using the same calculation method, the resulting value will not be same. Therefore, simply applying the offset value to the amount of electric power in the electric power receiving station may not achieve accurate correcting.

Therefore, in the embodiment of the present invention, the impedance value of the electric power transmission line 330 is corrected depending on a condition to correct for the difference between the first electric power loss amount and the second electric power loss amount.

For example, if an initial impedance value (value set during design) of the electric power transmission line is equal to 10, an impedance value of the electric power transmission line may be corrected as 9 by applying the offset value.

Meanwhile, such correcting is made depending on operation direction and operation electric power amount. In other words, the first conversion station is operated as an electric power transmission station and the second conversion station is operated as an electric power receiving station, and depending on the operation electric power amount transmitted from the first conversion station to the second conversion station, a correcting value is determined to correct impedance of the electric power transmission line.

Also, the first conversion station is operated as a electric power receiving station and the second conversion station is operated as a electric power transmission station, and depending on the operation electric power amount transmitted from the second conversion station to the first conversion station, a correcting value is determined to correct impedance of the electric power transmission line.

As described above, according to the embodiment of the present invention, the amount of electric power loss in the conversion stations is calculated and compared with the actual amount of electric power loss, and based on the result of the comparison, the error of the calculated amount of electric power loss is corrected, whereby an error of electric power loss in the conversion stations can be minimized.

Also, according to the embodiment of the present invention, impedance change due to the transmitted electric power of the electric power transmission line connecting a plurality of conversion stations is reflected to measure the amount of electric power loss generated between the plurality of conversion stations, whereby a loss of the transmitted electric power can be minimized simply and at the same time an error can be corrected.

Figure 15:
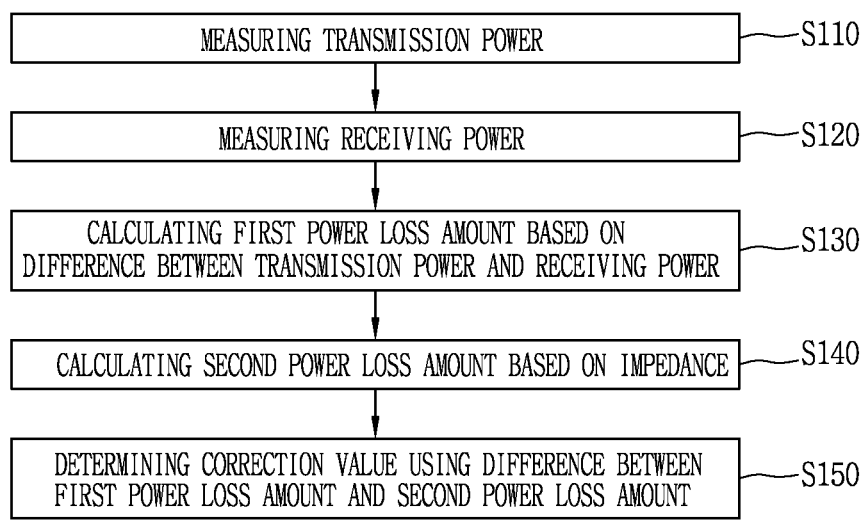
FIGS. 15 to 17 are flow charts illustrating a method for correcting electric power loss of an HVDC system according to the embodiment of the present invention.
Figure 16:
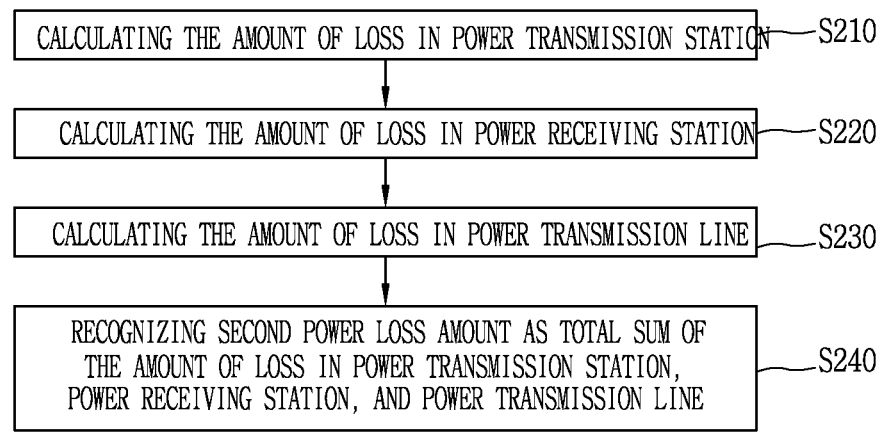
Figure 17:
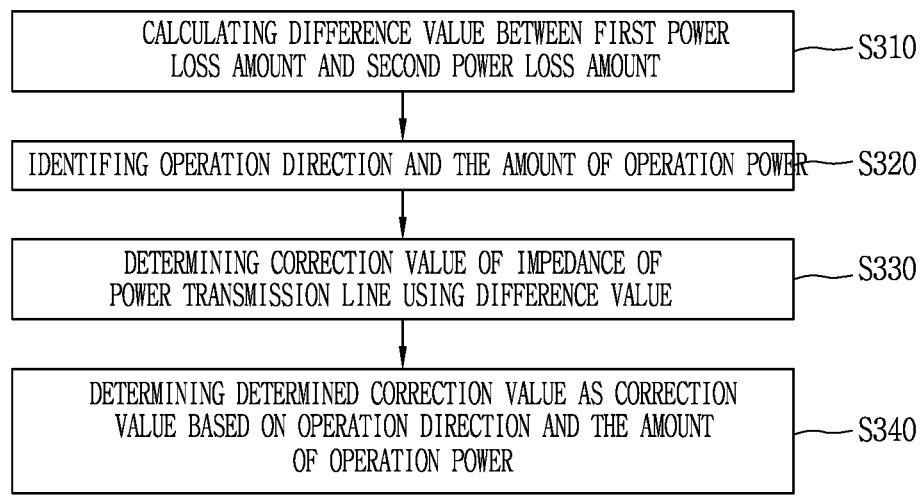

FIGS. 15 to 17 are flow charts illustrating a method for measuring electric power loss of an HVDC system according to the embodiment of the present invention.

Referring to FIG. 15, the electric power loss amount correcting device 400 measures the amount of transmission electric power (step 110). In the case where the first conversion station is operated as a electric power transmission station, the amount of transmission electric power may be the amount of the electric power in the first conversion station, and in the case where the second conversion station is operated as a electric power transmission station, it may be the amount of the electric power in the second conversion station.

Next, the electric power loss amount correcting device 400 measures the amount of receiving electric power (step 120). In the case where the first conversion station is operated as a electric power receiving station, the amount of receiving electric power may be the amount of the electric power in the first conversion station, and in the case where the second conversion station is operated as a electric power receiving station, it may be the amount of the electric power in the second conversion station.

Subsequently, the electric power loss amount correcting device 400 calculates the first electric power loss amount based on a difference value between the amount of transmission electric power and the amount of receiving electric power (step 130).

And, the electric power loss amount correcting device 400 calculates the second electric power loss amount based on an impedance value at each position (step 140).

Next, the electric power loss amount correcting device 400 determines a compensation value to correct for the amount of electric power loss based on the difference value between the first electric power loss amount and the second electric power loss amount (step 150).

Referring to FIG. 16, the electric power loss amount correcting device 400 calculates the amount of loss generated by the electric power transmission station based on the impedance value of the electric power transmission station (step 210).

Next, the electric power loss amount correcting device 400 calculates the amount of loss generated by the electric power receiving station based on the impedance value of the electric power receiving station (step 220).

Also, the electric power loss amount correcting device 400 calculates the amount of loss generated by the electric power transmission line based on the impedance value of the electric power transmission line connecting the electric power transmission station with the electric power receiving station (step 230).

Next, the electric power loss amount correcting device 400 determines the second electric power loss amount as a total sum of the amounts of loss at the electric power transmission station, the electric power receiving station, and the electric power transmission line (step 240).

Also, referring to FIG. 17, the electric power loss amount correcting device 400 calculates a difference value between the first electric power loss amount and the second electric power loss amount (step 310).

And, an operation direction and the amount of operation electric power of the HVDC system are identified (step 320).

Also, the electric power loss amount correcting device 400 determines a correcting value to correct the impedance value of the electric power transmission line by using the calculated difference value (step 330).

And, the electric power loss amount correcting device 400 determines the determined correcting value as a correcting value based on the identified operation direction and operation electric power (step 340).

According to the embodiment of the present invention, the amount of electric power loss in the conversion station is calculated and compared with the actual amount of electric power loss, and based on the result of the comparison, the error of the calculated amount of electric power loss is corrected, whereby an error of electric power loss in the conversion stations can be minimized.

Also, according to the embodiment of the present invention, impedance change due to the transmitted electric power of the electric power transmission line connecting a plurality of conversion stations is reflected to correct the amount of electric power loss generated between the plurality of conversion stations, whereby loss of the transmitted electric power can be minimized simply and at the same time an error can be corrected.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A method for correcting electric power loss of a high voltage direct current system, the method comprising the steps of:
   measuring the amount of transmission electric power and the amount of receiving electric power;
   calculating a first electric power loss amount based on a difference value between the measured amount of the transmission electric power and the measured amount of the receiving electric power;
   calculating the amount of loss generated in each of positions in the high voltage direct current system based on an impedance value of each of the positions;
   calculating a second electric power loss amount based on a sum value of the calculated loss amounts; and
   determining a correcting value for correcting the amount of electric power loss generated in the high voltage direct current system based on a difference value between the first electric power loss amount and the second electric power loss amount.

2. The method according to claim 1, wherein the step of calculating the amount of loss generated in each position comprises:

calculating the amount of loss generated in a first conversion station;
calculating the amount of loss generated in a second conversion station; and
calculating the amount of loss generated in an electric power transmission line connecting the first conversion station with the second conversion station.

3. The method according to claim 1, wherein the correcting value comprises an offset value for measuring the first electric power loss amount as the same value as the second electric power loss amount.

4. The method according to claim 2, wherein the amount of transmission electric power is the amount of electric power in the first conversion station or the second conversion station, depending on an operation direction of the high voltage direct current system, and the amount of receiving electric power is the amount of electric power in the second conversion station or the first conversion station, depending on the operation direction of the high voltage direct current system.

5. The method according to claim 3, wherein the offset value is a correcting value for correcting an impedance value of the electric power transmission line.

6. The method according to claim 4, wherein the correcting values are determined as different values depending on the operation direction of the high voltage direct current system, and the operation direction comprises a first operation direction operating the first conversion station as an electric power transmission station and the second conversion station as an electric power receiving station and a second operation direction operating the first conversion station as an electric power receiving station and the second conversion station as an electric power transmission station.

7. The method according to claim 6, wherein the correcting values are determined as different values depending on the amount of operation electric power transmitting from the electric power transmission station to the electric power receiving station.

* * * * *